(12) United States Patent
Lee (10) Patent No.: US 7,002,809 B2
(45) Date of Patent: Feb. 21, 2006

(54) LIQUID CRYSTAL DISPLAY DRIVER INTEGRATED CIRCUIT PACKAGE

(75) Inventor: Sung-Ho Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 91 days.

(21) Appl. No.: 10/427,411

(22) Filed: Apr. 30, 2003

(65) Prior Publication Data

US 2003/0202150 A1 Oct. 30, 2003

(30) Foreign Application Priority Data

Apr. 30, 2002 (KR) .......................... 2002-0023768

(51) Int. Cl.
*H01R 12/16* (2006.01)
(52) U.S. Cl. .......................... 361/789; 345/50; 345/55; 345/87; 345/92; 345/204; 345/206; 361/749; 361/750
(58) Field of Classification Search ................. 345/50, 345/55, 87, 92, 204, 206; 361/749, 750
See application file for complete search history.

(56) References Cited

U.S. PATENT DOCUMENTS 6,664,942 B1 * 12/2003 Kim et al. .................... 345/92

* cited by examiner

*Primary Examiner*—Mai-Huong Tran
(74) *Attorney, Agent, or Firm*—DLA Piper Rudnick Gray Cary US LLP (57) ABSTRACT

Disclosed is an LCD driver integrated circuit package and a chip on glass type LCD device using the package. The LCD driver integrated circuit package includes a mold that has signal output bumps and signal input bumps formed thereon, wherein the signal output bumps and the signal input bumps have different surface areas that contact the mold and an adjacent conductive film. Due to the different contact surface areas, different amounts of pressure are applied to different parts on the conductive film when a force is applied to the mold. One or more bump pressure control patterns are formed on the mold compensate for the difference in pressure caused by this difference between the total contact areas. Accordingly, the LCD driver integrated circuit package can be mounted on a chip on glass type LCD panel without causing device failure.

7 Claims, 8 Drawing Sheets

LIQUID CRYSTAL DISPLAY DRIVER INTEGRATED CIRCUIT PACKAGE

CROSS-REFERENCES TO RELATED APPLICATIONS

This patent application claims priority from Korean Patent Application No. 2002-23768 filed on Apr. 30, 2002 under 35 U.S.C. §119 and incorporates this Korean patent application by reference herein in its entirety.

BACKGROUND OF THE INVENTION

1. Field of the Invention

The disclosure relates to a liquid crystal display (LCD) driver integrated circuit package and a chip on glass type LCD device using the same, and more particularly to an LCD driver integrated circuit package and a chip on glass type LCD device capable of decreasing bonding failures that occur during a mounting process for an LCD device.

2. Description of the Prior Art

Generally, an LCD device is a flat panel display device for displaying characters, images and motion pictures by means of liquid crystal.

The LCD device includes an LCD panel for controlling the image that is generated, a light supplying device for providing light to the LCD and a driver module for driving the LCD panel to display desired images. The LCD panel is composed of a TFT (Thin Film Transistor) substrate, the liquid crystal and a color filter substrate.

The TFT substrate includes a glass substrate, TFTs arranged in a matrix on the glass substrate, gate lines and data lines for driving the TFT, and a transparent pixel electrode to which a voltage signal from the TFT is applied.

The color filter substrate includes a glass substrate, a color filter arranged in a matrix on the glass substrate to face the pixel electrode of the TFT substrate, and a common electrode formed on the whole glass substrate to cover the color filter.

The TFT substrate and the color filter substrate are positioned so that the pixel electrode is aligned with the color filter and a gap is formed between the TFT substrate and the color filter substrate. This gap is filled with a liquid crystal layer of a predetermined thickness.

The driver module provides a driving signal for displaying an image to the TFTs on the TFT substrate. This driver module is comprised of a PCB (Printed circuit board) and a TCP (Tape Carrier Package). The PCB converts an image signal input from a data processing device into a driving signal so that the driving signal is recognized by the LCD device.

The TCP is comprised of a base film and a driver IC. The base film is made of a synthetic resin having a thin plate shape, and the driver IC is mounted thereon. The driver IC provides the driving signals from the PCB to the LCD panel at a predetermined time interval. The PCB is bent toward a rear surface of the LCD panel by means of the flexible base film of the TCP.

Recently, an LCD driver integrated circuit package has been recently developed to manufacture a thinner and lighter LCD device. The LCD driver integrated circuit package can be easily mounted on the LCD panel. The LCD device mounted with LCD driver integrated circuit package is referred to as a chip on glass type LCD device.

Figure 1:
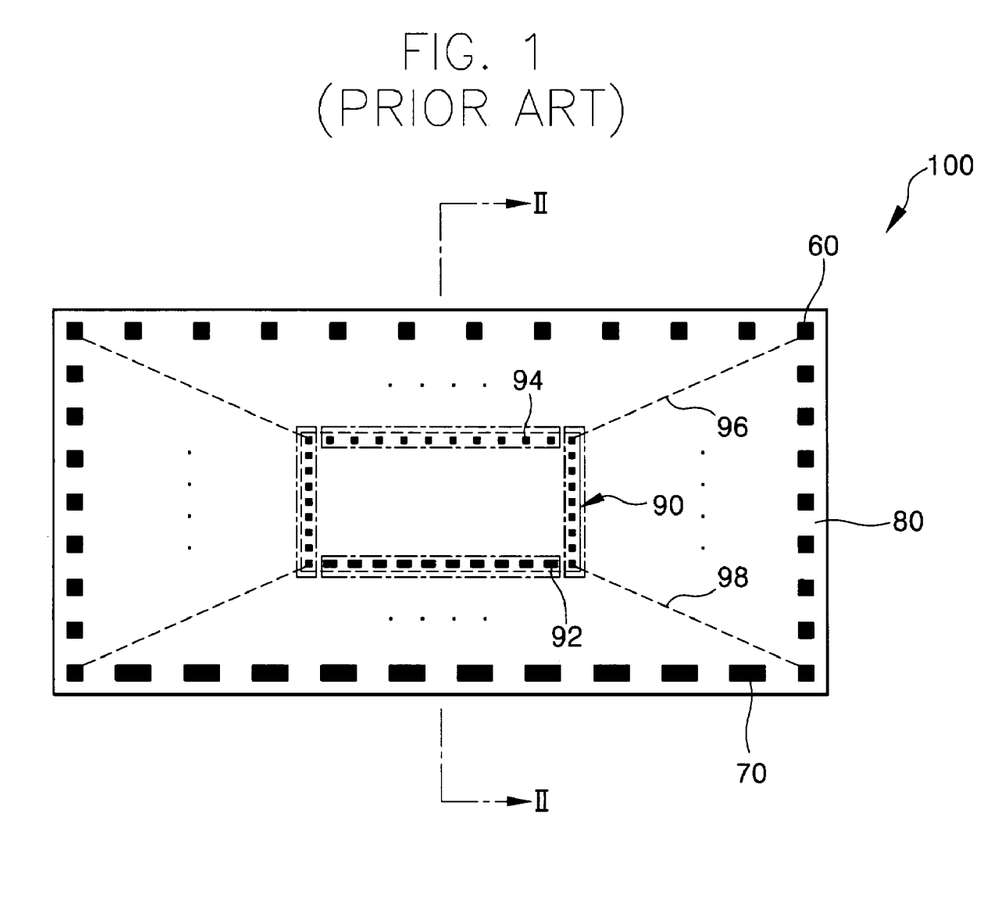
FIG. 1 is a schematic view showing a conventional LCD driver integrated circuit package.

FIG. 1 shows a schematic view showing a conventional LCD driver integrated circuit package.

Referring to FIG. 1, the LCD driver integrated circuit package 100 is a source driving integrated circuit package mounted on data lines. This LCD driver integrated circuit package 100 includes a driving signal processing module 90, a mold 80, image signal input bumps 70 and driving signal output bumps 60.

The driving signal processing module 90 converts an image signal from a data processing device into a driving signal capable of being recognized by the LCD device. The driving signal processing module 90 includes image signal input pads 92 and driving signal output pads 94. The image signal input pads 92 receives the image signal, and the driving signal output pads 94 output the converted driving signal.

Often, the driving signal output pads 94 and the image signal input pads 92 may not be directly mounted on a data line of the LCD panel and on a signal line of the PCB because the driving signal output pads 94 and the image signal input pads 92 have a narrow width (e.g., in the order of $\mu$m) and small dimensions.

For this reason, the conventional driving signal processing module 90 is enclosed by the mold 80, and the driving signal output bumps 60 are formed on the mold 80. The driving signal output bumps 60 have large enough width and dimension to be connected to the LCD panel. The driving signal output bumps 60 are connected to the driving signal output pads 94 through, for example, conductive wires 96. The image signal input bumps 70 are also formed on a surface of the mold 80 along an edge that is opposite the edge on which the driving signal output bumps 60 are formed. The image signal input bumps 70 have large enough width and dimensions to be connected to the signal line of the PCB. The image signal input bumps 70 are connected to the image signal input pads 92 through, for example, conductive wires 98.

Figure 2:
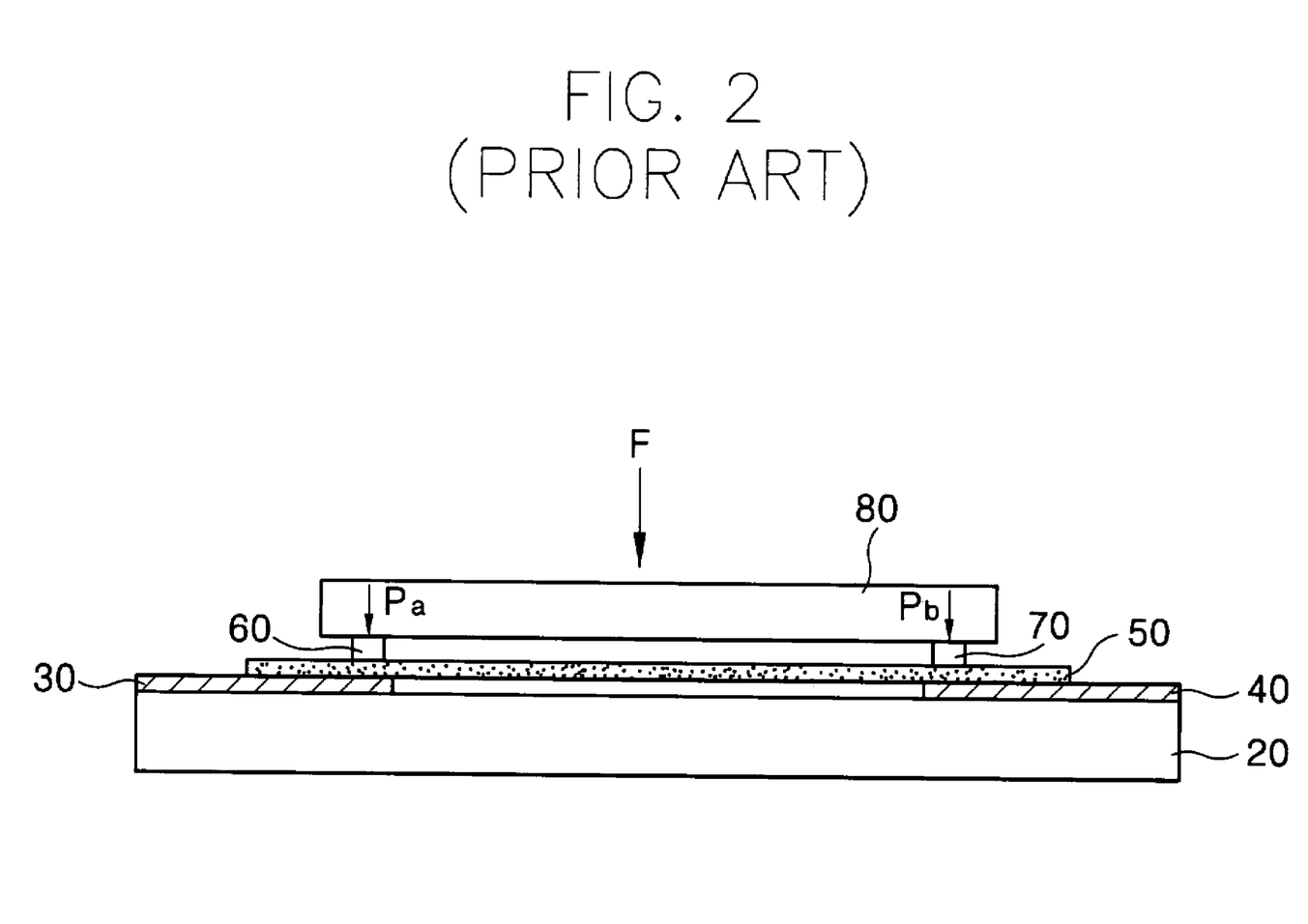
FIG. 2 is a cross sectional view cut along a line II—II of FIG. 1.

FIG. 2 is a cross sectional view cut along a line II—II of FIG. 1

Referring to FIG. 2, the image signal input bumps 70 are connected to conductive patterns 40 of the LCD panel so as to be connected to the PCB via an anisotropic conductive film (ACF) 50. The driving signal output bumps 60 are connected to data lines 30 of the LCD panel via the anisotropic conductive film 50. A transparent substrate 20 supports the conductive patterns 40, as shown.

As shown in FIG. 2, a bonding head (not shown) applies a force (F) to the LCD driver integrated circuit package 100. The driving signal output bumps 60 apply an amplified pressure Pa to the anisotropic conductive film 50 so that the driving signal output bumps 60, the anisotropic conductive film 50 and the data lines 30 are electrically connected with each other.

The force (F) is also applied to the image signal input bumps 70. The image signal input bumps 70 apply pressure Pb to the anisotropic conductive film 50 so that the image signal input bumps 70 the anisotropic conductive film 50 and the conductive patterns 40 are electrically connected with each other.

The chip on glass type LCD device is advantageous in that the dimension, weight and the number of required parts of the LCD device are greatly decreased. However, the chip on glass type LCD device also has limitations owing to characteristics of the chip on glass type LCD device.

Some of the limitations result from the difference between the total area of the image signal input bumps 70 and total areas of the driving signal output bumps 60. When the total area of the image signal input bumps 70 is different from the total area of the image signal output bumps 60, the image signal input bumps 70 and the driving signal output bumps 60 apply different pressures onto the substrate even though an equal force (F) is y applied to the image signal input bumps 70 and the driving signal output bumps 60.

When pressures from the image signal input bumps 70 and the driving signal output bumps are different from each other, for example when the total area of the respective image signal input bumps 70 is larger than the total area of the respective the driving signal output bumps 60, the pressure Pb applied onto the image signal input bumps 70 is smaller than the pressure Pa applied on the driving signal output bumps 60.

When the pressure Pb applied onto the image signal input bumps 70 is smaller than the pressure Pa applied on the driving signal output bumps 60, the driving signal output bumps 60 and the anisotropic conductive film 50 are excessively compressed in some cases. In other cases, the image signal input bumps 70 and the anisotropic conductive film 50 are not compressed sufficiently. This excessive or insufficient compression causes undesirable deteriorations in the electric characteristics, ultimately affecting the displayed image. An LCD driver integrated circuit package that does not suffer from this type of electric deteriorations is needed.

SUMMARY OF THE INVENTION

A first object of the present invention is to provide an LCD driver integrated circuit package for preventing mounting failures when signal input/output bumps formed on the LCD driver integrated circuit package are mounted at signal lines formed on a substrate.

A second object of the present invention is to provide an LCD device capable of maintaining an excellent image displaying quality by improving electrical defects in signal input/output processes in the LCD driver integrated circuit package.

To achieve the first object of the present invention, there is provided an integrated circuit package for driving an LCD device comprising: a driving signal generating chip including image signal input pads for receiving an image signal from a data processing device, a driving signal generating module for generating a driving signal by processing the image signal, and driving signal output pads for outputting the driving signal; a mold enclosing the driving signal generating chip; driving signal output bumps disposed in series on a surface of the mold to be connected to the driving signal output pads, the number of the driving signal output bumps being a first number; image signal input bumps disposed in series on the surface of the mold to be connected to the image signal input pads, the number of the image signal input bumps being a second number; and bump pressure controlling means formed on the surface of the mold, wherein the bump pressure controlling means maintains a pressure difference between a first pressure and a second pressure within a predetermined range, wherein the first pressure and the second pressure are applied onto the image signal input bumps and the driving signal output bumps, respectively, by a force applied to the mold.

To achieve the second object of the present invention, there is provided a chip-on-glass LCD device comprising: an LCD panel including driving signal input lines receiving a driving signal for controlling a liquid crystal and image signal input lines, wherein the image signal input lines are spaced apart from the driving signal input lines and receive an image signal from a data processing device; and a LCD driver integrated circuit package including: (a) a driving signal generating chip including image signal input pads for receiving an image signal from the data processing device, a driving signal generating module for generating a driving signal by processing the image signal, and driving signal output pads for outputting the driving signal; (b) a mold enclosing the driving signal generating chip; (c) driving signal output bumps disposed in series on a surface of the mold to connect the driving signal output pads to the driving signal input lines, the number of the driving signal output bumps being a first number; (d) image signal input bumps disposed in series on the surface of the mold to connected the image signal input pads to the image signal input lines, the number of the image signal input bumps being a second number; and (e) an anisotropic conductive film, a first portion of the anisotropic conductive film interposed between the driving signal output bumps and the driving signal input lines, and a second portion of the anisotropic conductive film interposed between the image signal input pads and the image signal input lines; and (f) bump pressure controlling means formed on the surface of the mold, wherein the bump pressure controlling means maintains a pressure difference between a first pressure and a second pressure within a predetermined range, the first pressure and the second pressure transferred to the anisotropic conductive film through the image signal input bumps and the driving signal output bumps, respectively, in response to a force applied to the mold.

According to the present invention, there is provided decreased difference between the area of the bumps mounted at the signal lines for receiving an image signal and the area of the bumps mounted at the signal lines for outputting the driving signal. As a result of this decrease, deterioration of electric characteristics is prevented when the bumps and the signal lines are connected to the anisotropic conductive films and a high quality of the displayed images is maintained in an LCD.

BRIEF DESCRIPTION OF THE DRAWINGS

The above objects and other advantages of the present invention will become more apparent by describing in detail in preferred embodiments thereof with reference to the attached drawings in which.

DETAILED DESCRIPTION OF THE PREFERRED EMBODIMENTS

Figure 3:
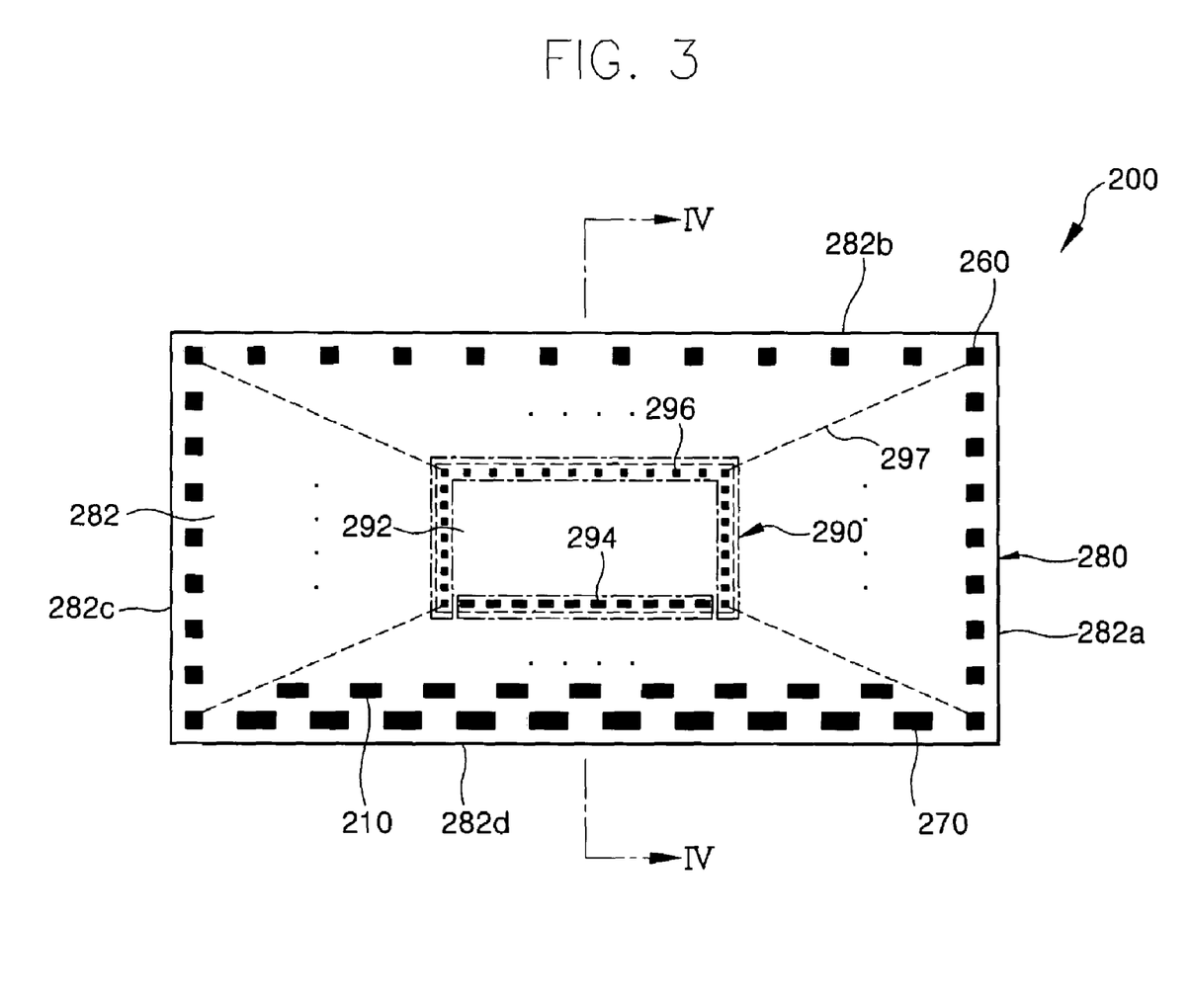
FIG. 3 is a schematic view showing an LCD driver integrated circuit package according to one exemplary embodiment of the present invention.

FIG. 3 is a schematic view showing an LCD driver integrated circuit package according to one exemplary embodiment of the present invention.

Referring to FIG. 3, a LCD driver integrated circuit package 200 includes a driving signal processing chip 290, a mold 280, driving signal output bumps 260, image signal input bumps 270 and bump pressure control patterns 210.

The driving signal processing chip 290 has a driving signal generating module 292, image signal input pads 294 and driving signal output pads 296. The driving signal generating module 292 processes an image signal from an external data processing device, and generates a driving signal for driving an LCD panel.

The image signal input pads 294 are formed on the driving signal generating module 292. A plurality of the image signal input pads 294 are arranged in a line at a portion of a surface of the driving signal generating module 292. The portion of the surface of the driving signal generating module 292 is a predetermined distance apart from a center of the driving signal generating module 292. The image signal input pads 294 apply the image signal to the driving signal generating module 292.

A plurality of the driving signal output pads 296 is arranged in a line at a second portion of the surface of the driving signal generating module 292 portions. The other portion of the surface of the driving signal generating module 292 is a predetermined distance apart from the center of the driving signal generating module 292. The driving signal output pads 296 receive the driving signal from the driving signal generating module 292.

The mold 280 having a rectangular shape encapsulates the driving signal generating module 292, the image signal input pads 294 and the driving signal processing chip 290 having the driving signal output pads 296.

The driving signal output bumps 260 and the image signal input bumps 270 are formed on the mold 280 that encloses the driving signal processing chip 290. The driving signal output bumps 260 and the image signal input bumps 270 are formed on a first surface 282 of the mold 280. The driving signal output pads 296 and the image signal input pads 294 are exposed at the first surface 282.

The driving signal output bumps 260 are connected to the driving signal output pads 296 via conductive patterns 297. A plurality of the driving signal output bumps 260 are formed in series on portions of the first surface 282 of the mold 280 adjacent to the driving signal output pads 296.

The number of the driving signal output bumps 260 is related to the resolution of the LCD panel. For example, when the resolution of the LCD panel is 128×160, there are required at least 384 (equivalent to 128×3) driving signal output bumps 260. In the preferred embodiment of the present invention, the number of the driving signal output bumps 260 is 420 to be a little more than 384. Because there exist a large number of the driving signal output bumps 260, as shown in FIG. 3, the driving signal output bumps 260 are arranged in series along three edges 282a, 282b and 282c among four edges 282a, 282b, 282c and 282d formed on the first surface 282 of the mold 280.

A plurality of image signal input bumps 270 are arranged in series along the rest edge 282d. The driving signal output bumps 260 are not formed along the edge 282d of the first surface 282.

The number of the image signal input bumps 270 are smaller than that of the driving signal output bumps 260 according to one exemplary embodiment of the present invention. The area of each respective driving signal output bump is smaller than the area of each respective image signal input bump. However, a first area that includes the total area of the driving signal output bumps is larger than a second area that includes the total area of the image signal input bumps. "Area," as used herein, refers to the surface area of the bump(s) that contact the mold and/or the anisotropic conductive film (see FIG. 2).

Figure 4:
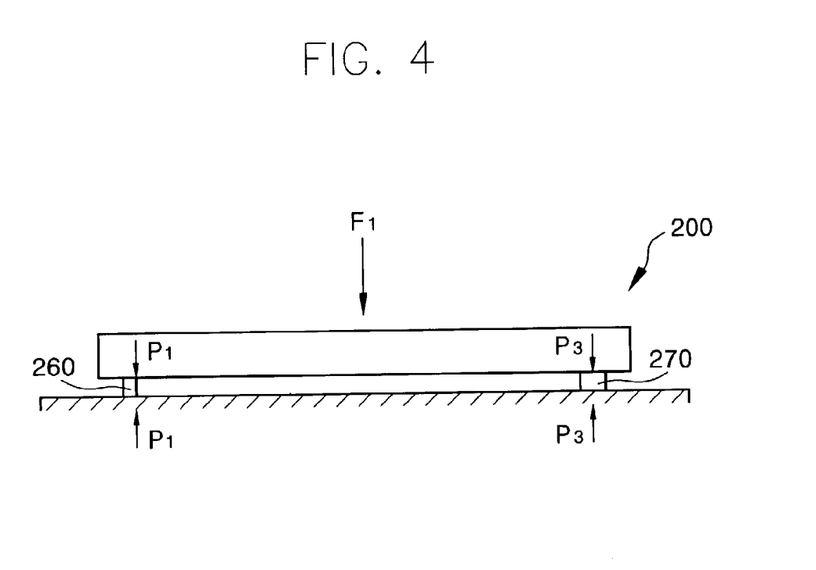
FIG. 4 is a schematic view showing a pressure difference between the pressure of image signal input bumps and the pressure of driving signal output bumps when a bump pressure controlling means is not formed at the LCD driver integrated circuit package of FIG. 3.

FIG. 4 is a schematic view showing a pressure difference between the pressure of image signal input bumps and the pressure of driving signal output bumps when a bump pressure controlling means is not formed at the LCD driver integrated circuit package of FIG. 3.

Referring to FIG. 4, the first area is larger than the second area. Accordingly, when the same force $F_1$ applies to both the image signal input bumps 270 and the driving signal output bumps 260, a pressure $P_1$ by the driving signal output bumps 260 is less than a pressure $P_3$ by the image signal input bumps 270 due to the relationship (P=F/A) among pressure, force and area.

Figure 5:
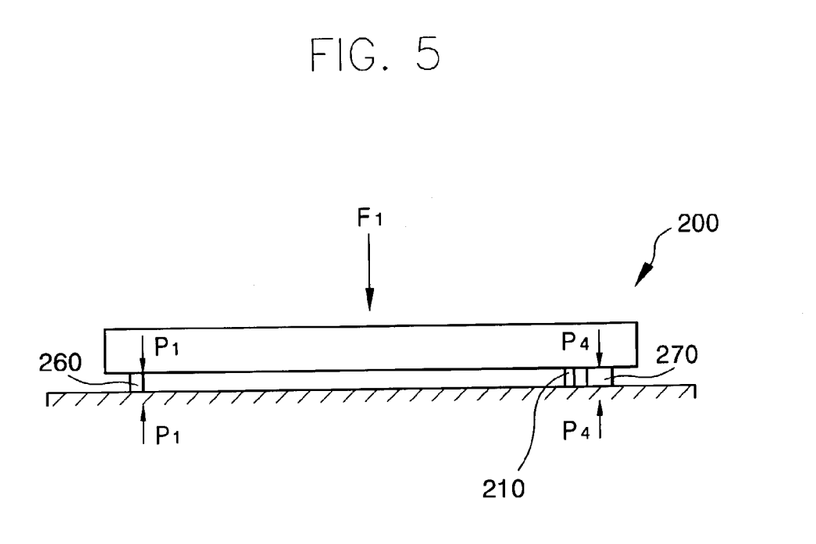
FIG. 5 is a schematic view showing a pressure difference between the pressure of image signal input bumps and the pressure of driving signal output bumps when a bump pressure controlling means is formed at the LCD driver integrated circuit package of FIG. 3.

FIG. 5 is a cross sectional view cut along a line IV—IV of FIG. 3.

Referring to FIG. 3 and FIG. 5, the bump pressure control patterns 210 are formed on a first surface 282 of the mold 280. The bump pressure control patterns 210 are used so that the pressure $P_1$ by the driving signal output bumps 260 is equal to a pressure $P_4$ by the image signal input bumps 270.

According to one exemplary embodiment of the present invention, the bump pressure control patterns 210 is formed together with the image signal input bumps 270 and the driving signal output bumps 260. The bump pressure control patterns 210 minimize the area difference between the first area and the second area.

In one embodiment, the bump pressure control patterns 210 are dummy patterns for controlling sizes of the first area and the second area.

After the area difference between the first area and the second area is acquired, the area of the bump pressure control bumps 210 is calculated by simulation, etc.

Figure 6:
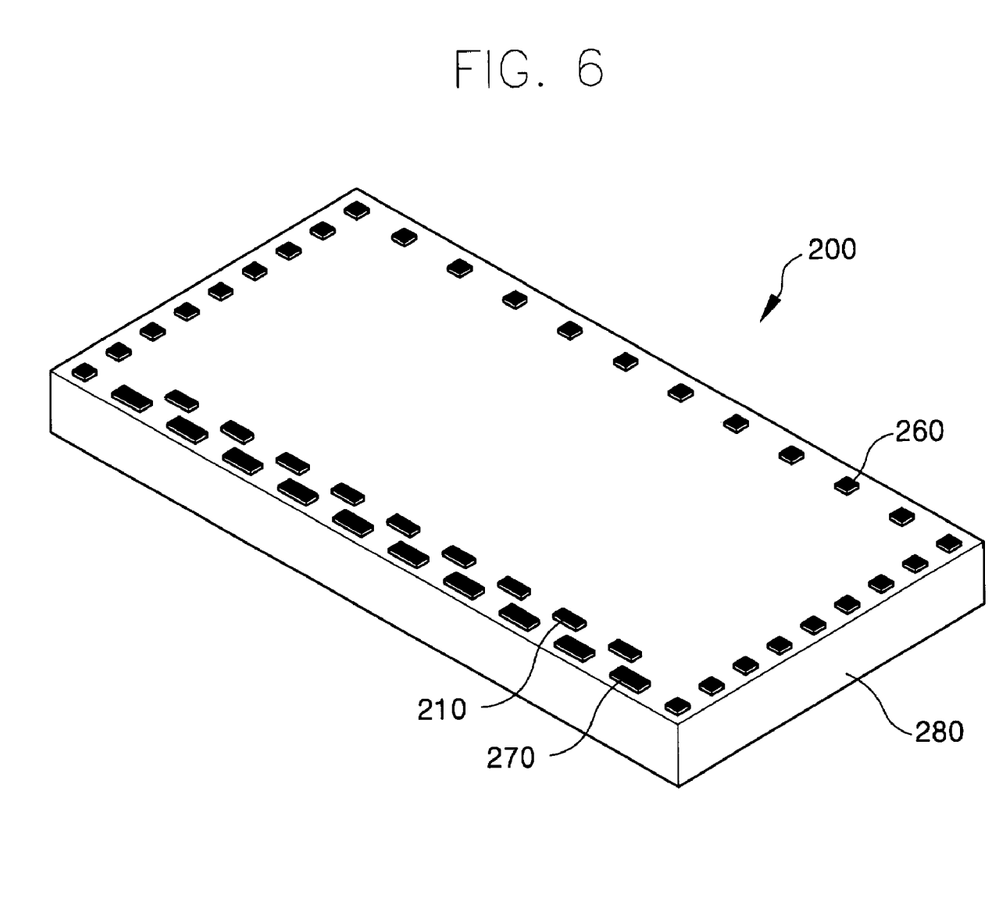
FIG. 6 is a perspective view showing the location on the LCD driver integrated. circuit package where the bump pressure controlling means are formed thereon according to one exemplary embodiment of the present invention.
Figure 7:
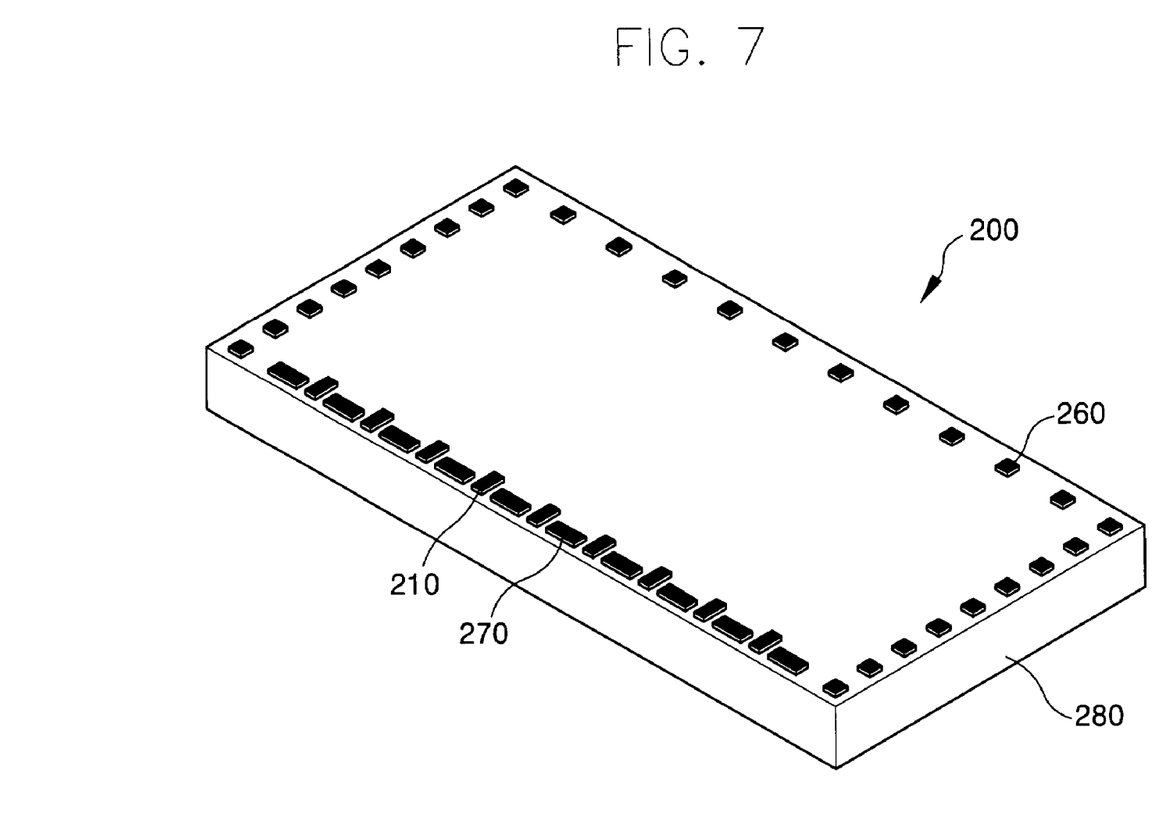
FIG. 7 is a perspective view showing another exemplary embodiment of FIG. 6.

FIG. 6 is a perspective view showing the location on the LCD driver integrated circuit package where the bump pressure controlling means are formed thereon according to one exemplary embodiment of the present invention, FIG. 7 is a perspective view showing another exemplary embodiment of FIG. 6.

Referring to FIG. 6 and FIG. 7, the bump pressure control patterns 210 are formed between the image signal input bumps 270 and the driving signal output bumps 260 as shown in FIG. 6, or between the image signal input bumps 270 as shown in FIG. 7.

Figure 8:
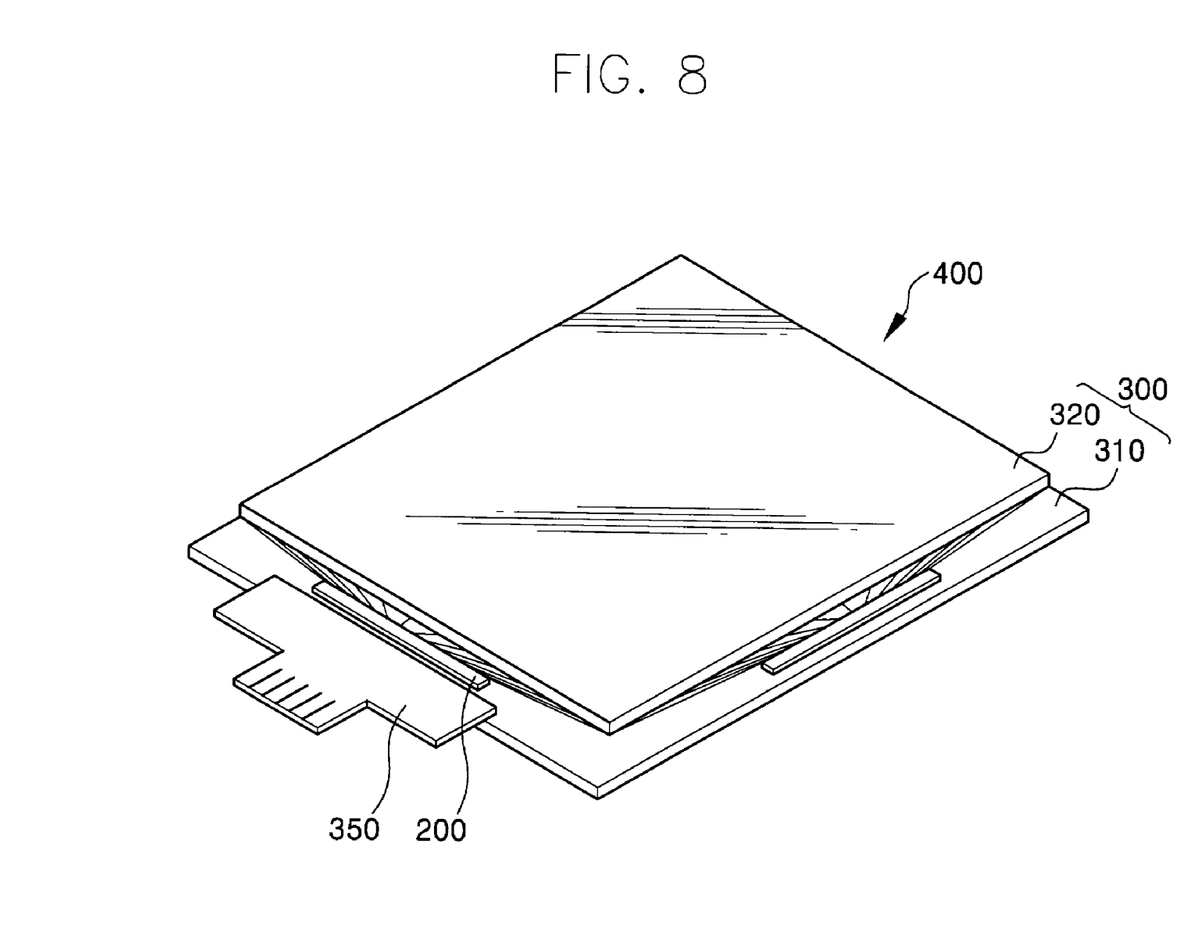
FIG. 8 is a perspective view sowing an LCD device mounted with the LCD driver integrated circuit package according to one exemplary embodiment of the present invention.
Figure 9:
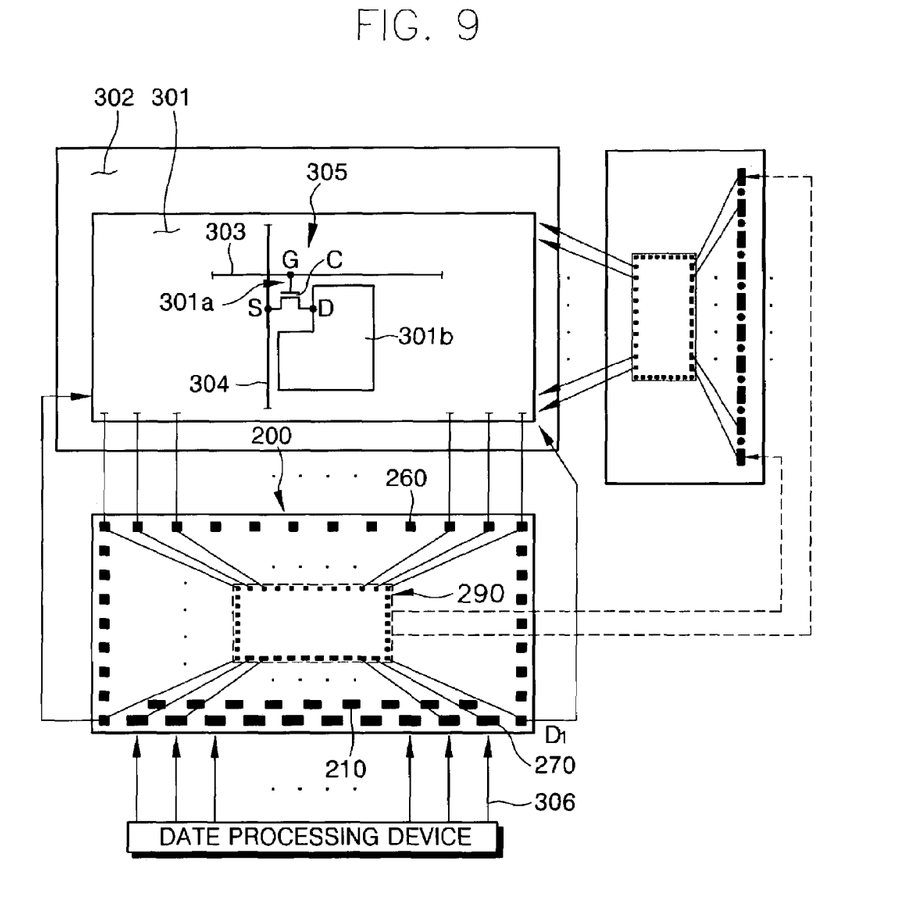
FIG. 9 is a schematic view showing a TFT substrate of the LCD device according to one exemplary embodiment of the present invention.

FIG. 8 is a perspective view showing an LCD device mounted with the LCD driver integrated circuit package according to one exemplary embodiment of the present invention, and FIG. 9 is a schematic view showing a TFT substrate of the LCD according to one exemplary embodiment of the present invention.

Referring to FIG. 8 and FIG. 9, a chip on glass type LCD device 400 includes an LCD panel 300, the LCD driver integrated circuit package 200 and a flexible printed circuit board 350 for outputting the image signal from the data processing device to the LCD driver integrated circuit package 200.

More particularly, the LCD panel 300 includes a TFT substrate 310, liquid crystal (not shown) and a color filter substrate 320.

The TFT substrate 310 is divided into an active display area 301 and an inactive display area 302 as shown in FIG. 9. A liquid crystal controlling part 305 is disposed in the active display area 301. The liquid crystal controlling part 305 includes TFTs 301a and pixel electrodes 301b. Each of the TFTs has a gate electrode G, a source electrode S, a channel layer C and a drain electrode D.

The gate electrode G of the TFT 301a is connected to a gate line 303, and the source electrode S of the TFT 301 a is connected to a data line 304 so as to operate the TFTs 301 a of the liquid crystal controlling part 305. Driving lines is comprised of the gate lines 303 and the data lines 304, the driving lines are extended from the active display area 301 to the inactive display area 302.

Image signal input lines are additionally disposed on the TFT substrate 310 so as to receive the image signal from the data processing device. The image signal input lines are spaced apart from the data line 304.

On the other hand, the color filter substrate 320 (refer to FIG. 8) is opposite to the active display area 301 of the TFT substrate 310. The color filter substrate 320 includes a color filter (not shown) and a common electrode (not shown). The color filter is positioned near the pixel electrode 310b and covered with a common electrode.

The liquid crystal is injected into a gap between the TFT substrate 310 (See FIG. 8) and the color filter substrate 320 thereby producing the LCD panel 300.

The image signal input bumps 270 of the LCD driver integrated circuit package 200 are connected to the image signal input lines 306 formed on the TFT substrate 310 of the LCD panel 300 through the anisotropic conductive film. The driving signal output bumps 260 of the LCD driver integrated circuit package 200 is also connected to the date line 304 of the TFT substrate 310 through the anisotropic conductive film.

The LCD driver integrated circuit package 200 is pressurized by a bonding head so that the image signal inputting bumps 270 are connected to the image signal input lines of the LCD driver integrated circuit package 200 through the anisotropic conductive films, and the driving signal output bumps 260 are connected to the data line 304 through the anisotropic conductive films.

The bump pressure control patterns 201 compensate for the pressure difference caused by the difference between the total area of the image signal input bumps 270 and the total area of the driving signal output bumps 260, so that the image signal input bumps 270 can be precisely attached to the anisotropic conductive films and the driving signal output bumps 260 can be precisely attached to the anisotropic conductive films.

For example, the bump pressure control patterns can be disposed between the image signal input bumps 270, or between the image signal input bumps 270 and the driving signal output bumps 260.

According to the present invention, the pressure deviation that is caused by the difference between the total area of the image signal input bumps and the total area of the driving signal output bumps can be minimized or eliminated when the LCD driver integrated circuit package is combined with the LCD panel. Thus, the LCD driver integrated circuit package can be mounted on the LCD panel without causing device failure.

Although preferred embodiments of the invention have been described, it will be understood by those skilled in the art that the present invention should not be limited to the described preferred embodiment, but various changes and modifications can be made within the spirit and scope of the invention as defined by the appended claims.

What is claimed is:

1. An integrated circuit package for driving a liquid crystal display device, said integrated circuit package comprising:
   a driving signal generating chip including image signal input pads for receiving an image signal from a data processing device, a driving signal generating module for generating a driving signal by processing the image signal, and driving signal output pads for outputting the driving signal;
   a mold for enclosing the driving signal generating chip;
   a first number of driving signal output bumps disposed in series on a first surface of the mold to be connected to the driving signal output pads;
   a second number of image signal input bumps disposed in series on the first surface of the mold to be connected to the image signal input pads; and
   bump pressure controlling means formed on the first surface of the mold, wherein the bump pressure controlling means maintains a predetermined pressure deviations between a second pressure and a third pressure, the second pressure being applied onto the image signal input bumps by a first pressure applied onto a second surface of the mold opposite to the first surface, and a third pressure being applied onto the driving signal output bumps by the first pressure.

2. The integrated circuit package as claimed in claim 1, wherein the bump pressure controlling means is dummy bumps formed on the surface of the mold.

3. The integrated circuit package as claimed in claim 2, wherein the dummy bumps are arranged in series between the driving signal output bumps and the image signal input bumps.

4. The integrated circuit package as claimed in claim 2, wherein the dummy bumps are formed between the image signal input bumps.

5. The integrated circuit package as claimed in claim 1, wherein the surface of the mold has a rectangular shape with four edges, the driving signal output bumps are arranged in series along three of the four edges, and the image signal input bumps are arranged in series along an edge except the three edges of the four edges.

6. The integrated circuit package as claimed in claim 1, wherein the first number of the driving signal output bumps is greater than the second number of the image signal input bumps.

7. A chip-on-glass type liquid crystal display device comprising:
   a liquid crystal display panel including driving signal input lines receiving a driving signal for controlling a liquid crystal and image signal input lines, in which the image signal input lines are spaced apart from the driving signal input lines and receive an image signal from a data processing device; and
   a liquid crystal display driver integrated circuit package including:
   (a) a driving signal generating chip including image signal input pads for receiving an image signal from the data processing device, a driving signal generating module for generating a driving signal by processing the image signal, and driving signal output pads for outputting the driving signal;

(b) a mold for enclosing the driving signal generating chip;

(c) a first number of driving signal output bumps disposed in series on a first surface of the mold to connect the driving signal output pads to the driving signal input lines;

(d) a second number of image signal input bumps disposed in series on the first surface of the mold to connected the image signal input pads to the image signal input lines; and (e) an anisotropic conductive film, a first portion of the anisotropic conductive film interposed between the driving signal output bumps and the driving signal input lines, and a second portion of the anisotropic conductive film interposed between the image signal input pads and the image signal input lines; and (f) bump pressure controlling means formed on the first surface of the mold, wherein the bump pressure controlling means maintains a predetermined pressure deviations between a second pressure and a third pressure, the second pressure being transferred to the anisotropic conductive film through the image signal input bumps by a first pressure applied onto a second surface of the mold opposite to the first surface, and a third pressure being transferred to the anisotropic conductive film through the driving signal output bumps.

* * * * *